(12) United States Patent
Chang et al.

(10) Patent No.: US 7,511,417 B2
(45) Date of Patent: Mar. 31, 2009

(54) ORGANIC LIGHT-EMITTING SOURCE WITH LIGHT-GUIDING SUBSTRATE

(75) Inventors: Yih Chang, Jhonghe (TW); Tien Rong Lu, Tainan (TW)

(73) Assignee: Ritdisplay Corporation, Hsinchu County (TW)

( * ) Notice: Subject to any disclaimer, the term of this patent is extended or adjusted under 35 U.S.C. 154(b) by 749 days.

(21) Appl. No.: 11/180,590

(22) Filed: Jul. 14, 2005

(65) Prior Publication Data

US 2006/0012291 A1   Jan. 19, 2006

(30) Foreign Application Priority Data

Jul. 15, 2004   (TW) .............................. 93121195 A

(51) Int. Cl.
*H01J 1/62*   (2006.01)
(52) U.S. Cl. ...................................... 313/504; 313/500
(58) Field of Classification Search ................. 313/512, 313/505, 506, 500
See application file for complete search history.

(56) References Cited

U.S. PATENT DOCUMENTS 6,417,523 B1 *   7/2002   Swanson ...................... 257/88

* cited by examiner

*Primary Examiner*—Joseph L Williams
(74) *Attorney, Agent, or Firm*—Birch, Stewart, Kolasch & Birch, LLP

(57) ABSTRACT

An organic light-emitting source includes a light-guiding substrate, at least one light-source area and a reflecting layer. The light-guiding substrate has a first surface and a second surface. The first surface includes at least one light-guiding part, which is a light guiding structure disposed on the light-guiding substrate. The light-source area includes at least one organic electroluminescent device, which sequentially includes a first electrode, at least one organic functional layer and a second electrode disposed over the first surface of the light-guiding substrate. The reflecting layer is disposed over the second surface of the light-guiding substrate.

20 Claims, 6 Drawing Sheets

ORGANIC LIGHT-EMITTING SOURCE WITH LIGHT-GUIDING SUBSTRATE

BACKGROUND OF THE INVENTION

1. Field of Invention

The present invention relates to a light-emitting source and, in particular, to an organic light-emitting source.

2. Related Art

Due to the rapid development of technology, flat panel display (FPD) has become the major display. Although liquid crystal display (LCD) is one of the most popular FPD technologies, however, organic electroluminescent display possesses excellent advantages such as self-emission, low power consumption, thin thickness, light weight, wide viewing angle, rapid response rate, high contrast and brightness, wide operation temperature, easily be manufactured, low cost and full color, and it has become another popular display among FPD.

Organic electroluminescent display is composed of a plurality of organic electroluminescent devices. Organic electroluminescent device utilizes the self-emissive properties of organic functional materials to achieve display and it is classified into small molecule OLED (SM-OLED) and polymer light-emitting device (PLED) according to different molecular weights of organic functional materials.

As shown in FIG. 1, a conventional bottom light-emitting type organic electroluminescent device 1 comprises a transparent substrate 11, a transparent anode 12, an organic functional layer 13 and a metal cathode 14. The transparent substrate 11 has a first surface 111 and a second surface 112, and it is made of glass. The material of the transparent anode 12 is indium tin oxide (ITO). The organic functional layer 13 is a multilayer organic film structure. The metal cathode 14 is made of aluminum, calcium or magnesium-silver alloy. The transparent anode 12 is disposed on the first surface 111 of the transparent substrate 11. The organic functional layer 13 is disposed on the transparent anode 12. The metal cathode 14 is disposed on the organic functional layer 13. The organic functional layer 13 comprises a hole-transporting layer, an organic light-emitting layer and an electron-transporting layer.

As to the organic electroluminescent device 1, refractive index $n_1$ of the organic functional layer 13 and refractive index $n_2$ of the transparent anode 12 are close ($n_1$ is about 1.7 and $n_2$ is about 1.8 to 2.0). Refractive index $n_1$ is greater than refractive index $n_3$ (about 1.5) of the transparent substrate 11 and refractive index $n_3$ is greater than that of air (about 1.0). The light 15 emitted from the organic functional layer 13 is propagated out of the device from the transparent substrate 11 because the metal cathode 14 is an opaque reflective layer.

According to Snell's Law, when the light 15 goes through an interface, the product of the refractive index and the sine of the incident angle in the incident medium are equal to that in the refractive medium. When the light 15 is propagated from the transparent anode 12 into the transparent substrate 11 and the incident angle is greater than $\sin^{-1}(n_3/n_2)$, the light 15 is totally reflected and is restricted to propagating within the organic functional layer 13 and the transparent anode 12 resulting in a waveguide phenomenon between the anode and the organic functional layer. If the incident angle of the light 15 is smaller than $\sin^{-1}(n_3/n_2)$, the light 15 is propagated into the transparent substrate 11. When the light 15 is propagated from the transparent substrate 11 to outside and the incident angle is greater than $\sin^{-1}(1/n_3)$, the light 15 is totally reflected and is restricted within the transparent substrate 11 resulting in a substrate waveguide phenomenon. If the incident angle of the light 15 is smaller than $\sin^{-1}(1/n_3)$, the light 15 is propagated out of the device.

As the description above, only about 20% of the light is propagated out of the device and 80% of the light is propagated within substrate and anode resulting in waveguide phenomenon then is further propagated out of the device from the lateral side. Thus, the low external quantum efficiency is the drawback of organic electroluminescent device.

However, if external quantum efficiency could be enhanced, organic electroluminescent device can not only be applied to display but also to lighting or back lighting. It is therefore an important subject of the present invention to provide an organic light-emitting source with a high external quantum efficiency to solve above-mentioned problems and be applied to lighting and back lighting.

SUMMARY OF THE INVENTION

In view of the foregoing, the present invention is to provide an organic light-emitting source with a high external quantum efficiency. By integrating a light-guiding layer with a substrate of an organic electroluminescent device can reduce optical loss between the interface of lighting or back lighting and the light-guiding layer.

To achieve the above, an organic light-emitting source according to the present invention comprises a light-guiding substrate, at least one light-source area and a reflecting layer. The light-guiding substrate has a first surface and a second surface. The first surface comprises at least one light-guiding part, which is a light guiding structure disposed on the light-guiding substrate. The light-source area comprises at least one organic electroluminescent device, which sequentially comprises a first electrode, at least one organic functional layer and a second electrode disposed over the first surface of the light-guiding substrate. The reflecting layer is disposed over the second surface of the light-guiding substrate.

To achieve the above, another organic light-emitting source according to the present invention comprises a light-guiding substrate, at least one light-source area and a reflecting layer. The light-guiding substrate has a first surface and a second surface. The second surface comprises at least one light-guiding part, which is a light guiding structure disposed on the light-guiding substrate. The light-source area comprises at least one organic electroluminescent device, which sequentially comprises a first electrode, at least one organic functional layer and a second electrode disposed over the first surface of the light-guiding substrate. The reflecting layer is at least a portion disposed over the second electrode.

To achieve the above, the other organic light-emitting source according to the present invention comprises a light-guiding substrate, at least one light-source area, a first reflecting layer and a second reflecting layer. The light-guiding substrate has a first surface and a second surface. The first surface comprises at least one light-guiding part, which is a light guiding structure disposed on the light-guiding substrate. The light-source area comprises at least one organic electroluminescent device, which sequentially comprises a first electrode, at least one organic functional layer and a second electrode disposed over the first surface of the light-guiding substrate. The first reflecting layer is disposed over the second surface of the light-guiding substrate. The second reflecting layer is disposed over the second electrode.

As mentioned above, a reflecting layer guides the light of the present organic light-emitting source into the light-guiding substrate, then a light is propagated out by a light guiding structure to achieve a high external quantum efficiency. The present invention integrates a light-guiding layer of lighting or back lighting with a substrate of an organic electroluminescent device into a single component. The integration significantly simplifies the connection process of the light-guiding layer and the light-emitting source and reduces optical loss between the interface of the light-emitting source and the light-guiding layer.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings respectively showing a bottom light-emitting type, a top light-emitting type and a total transparent light-emitting type of an organic light-emitting source according to the present invention, wherein the same references relate to the same elements.

Figure 1:
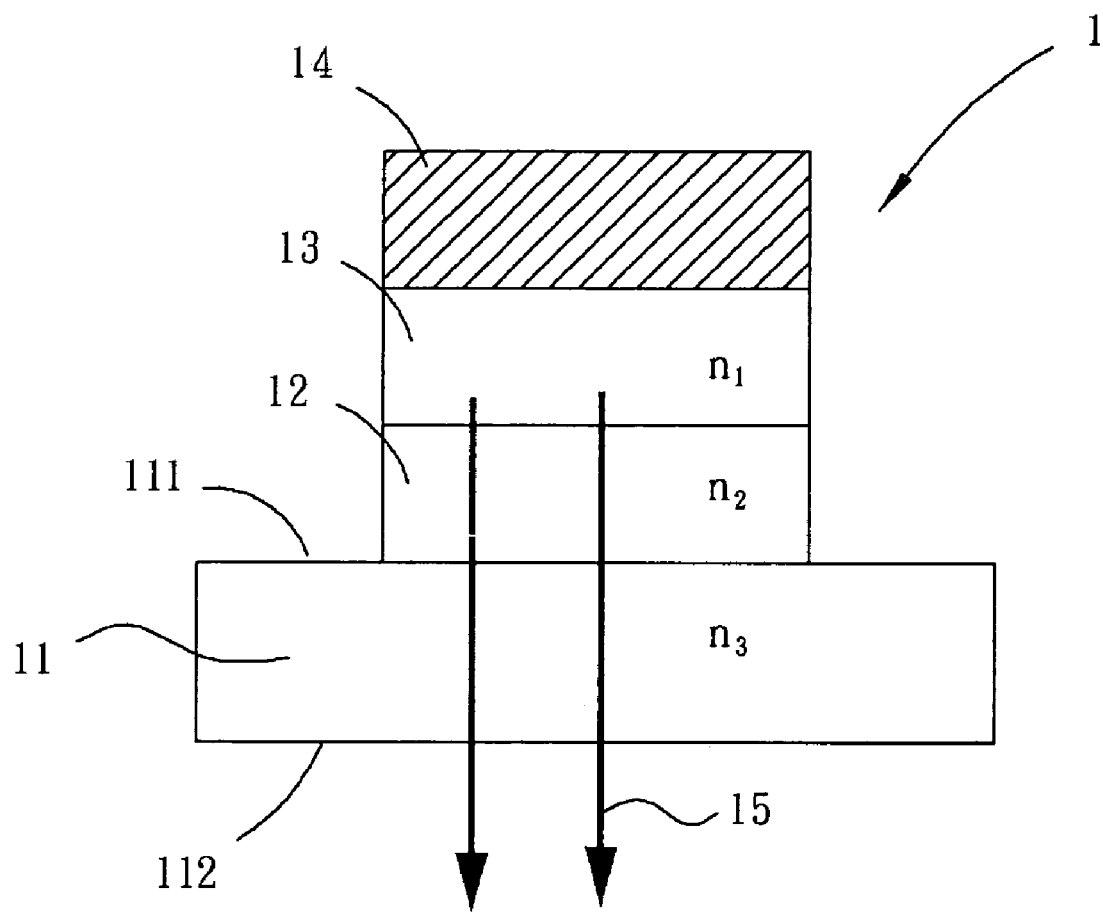
FIG. 1 is a schematic view showing a conventional organic electroluminescent device.
Figure 2:
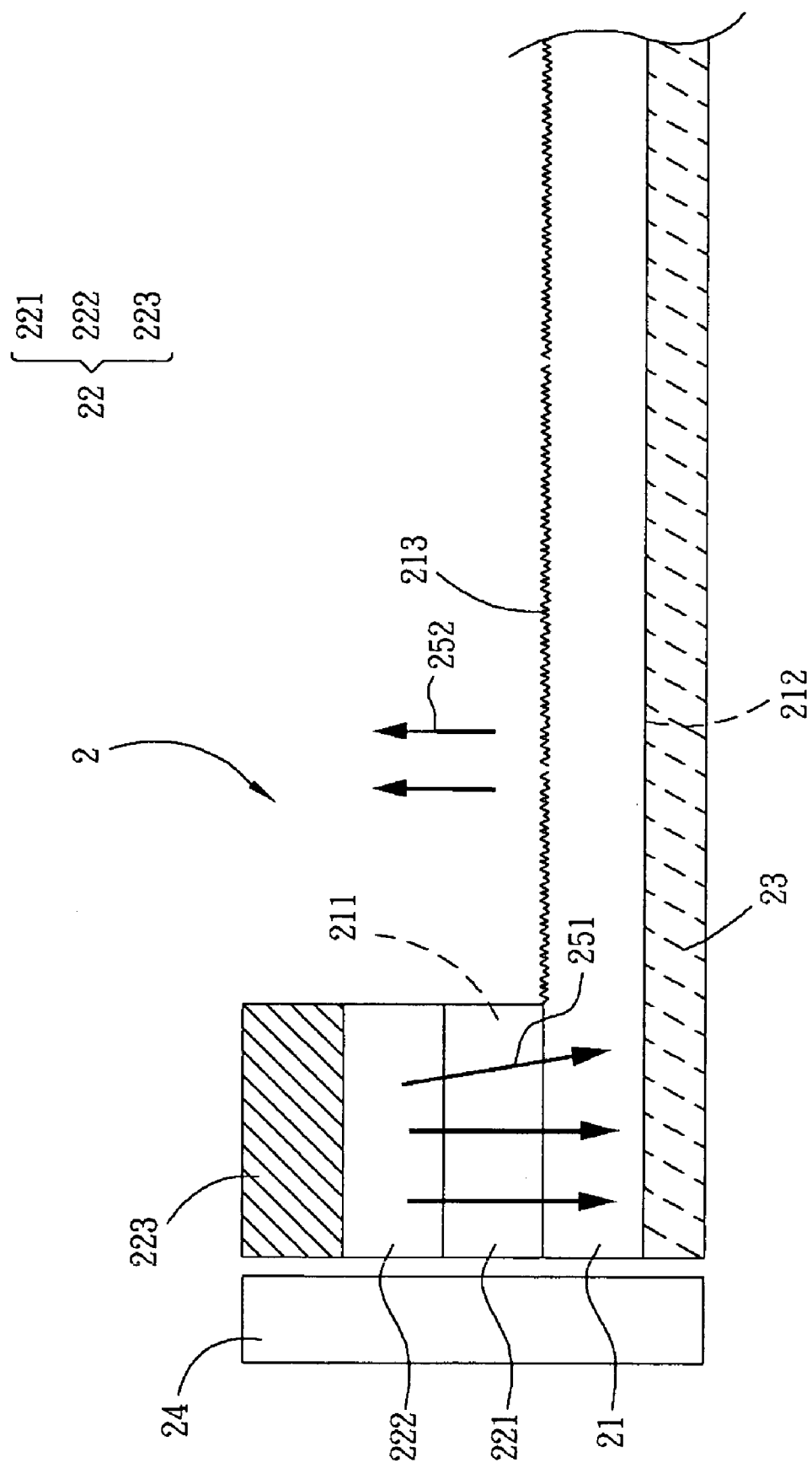
FIG. 2 is a schematic view showing a first embodiment of an organic light-emitting source according to the present invention.

As shown in FIG. 2, a first embodiment of an organic light-emitting source 2 according to the present invention comprises a light-guiding substrate 21, at least one light-source area 22 and a reflecting layer 23.

The light-guiding substrate 21 has a first surface 211 and a second surface 212. The first surface 211 comprises at least one light-guiding part 213, which is a light guiding structure disposed on the light-guiding substrate 21. The light-source area 22 comprises at least one organic electroluminescent device, which sequentially comprises a first electrode 221, at least one organic functional layer 222 and a second electrode 223 disposed over the first surface 211 of the light-guiding substrate 21. The reflecting layer 23 is disposed over the second surface 212 of the light-guiding substrate 21 to reflect a light to the light-guiding part 213. At least one light-blocking layer 24 may be further disposed at one side of the light-guiding substrate 21 to restrict the direction of the light emitted from the organic functional layer 222 and the light is efficiently propagated out from the light-guiding part 213. At least one light-blocking layer (not shown) may also be further disposed at one side of the first electrode 221, the organic functional layer 222 and/or the second electrode 223 to restrict the direction of the light emitted from the organic functional layer 222 and the light is efficiently propagated out from the light-guiding part 213.

In this embodiment, the light-guiding substrate 21 is at least one selected from the group consisting of rigid light-guiding substrate, flexible light-guiding substrate, transparent light-guiding substrate, glass light-guiding substrate, plastic light-guiding substrate and silicon light-guiding substrate. The light guiding structure is at least one selected from the group consisting of frosted surface structure, rough surface structure, ITO structure, microlens array structure and multilayer structure. The light guiding structure is for propagating the light uniformly and efficiently out. The reflecting layer 23 and the light-blocking layer 24 may be made of high reflective materials, for example metal (such as aluminum) or alloy. The first electrode 221 is made of conductive metal oxide, which is at lest one selected from the group consisting of indium tin oxide, aluminum zinc oxide, indium zinc oxide and cadmium tin oxide. The organic functional layer 222 may be made of fluorescent material or phosphorescent material, also may be made of small-molecular organic material or polymeric organic material. The second electrode 223 is at least one selected from the group consisting of aluminum, calcium, magnesium, indium, tin, manganese, silver, gold, magnesium alloy and the combination thereof. Magnesium alloy is for example, but not be limited to, magnesium-silver alloy (Mg:Ag), magnesium-indium (Mg:In) alloy, magnesium-tin alloy (Mg:Sn), magnesium-antimony (Mg:Sb) alloy or magnesium-tellurium (Mg:Te) alloy.

In this embodiment, due to the second electrode 223 is an opaque reflective layer, a first light 251 emitted from the organic functional layer 222 is restricted to be propagated into the light-guiding substrate 21. The first light 251 is reflected by the reflecting layer 23 and the light-blocking layer 24. Finally, a second light 252 is propagated out from the light-guiding part 213. By the light guiding structure of the light-guiding part 213, the second light 252 is uniformly and efficiently propagated out.

Figure 3:
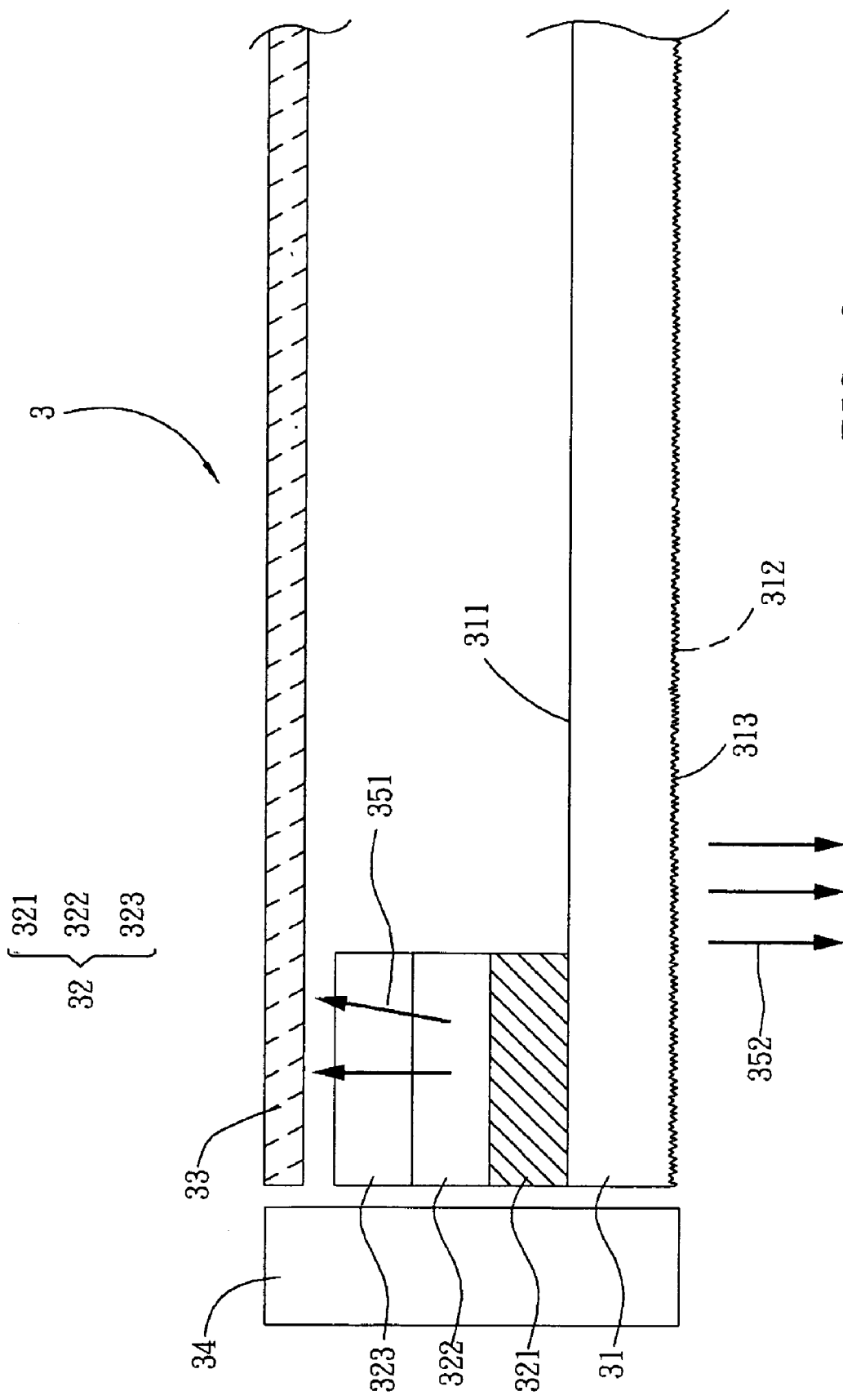
FIG. 3 is a schematic view showing a second embodiment of an organic light-emitting source according to the present invention.

As shown in FIG. 3, a second embodiment of an organic light-emitting source 3 according to the present invention comprises a light-guiding substrate 31, at least one light-source area 32 and a reflecting layer 33.

Figure 4A:
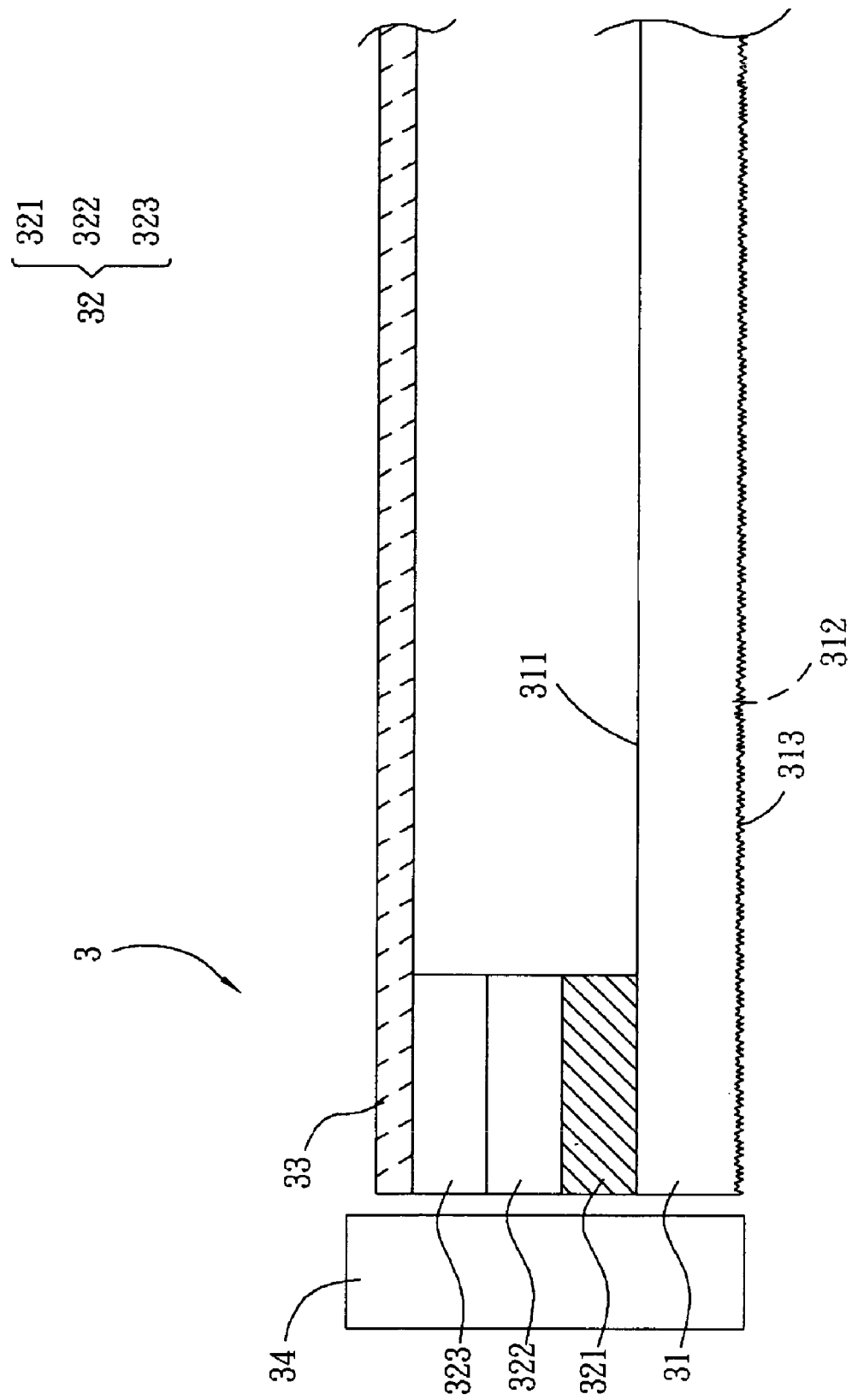
FIGS. 4A and 4B are another schematic views showing the second embodiment of an organic light-emitting source according to the present invention.
Figure 4B:
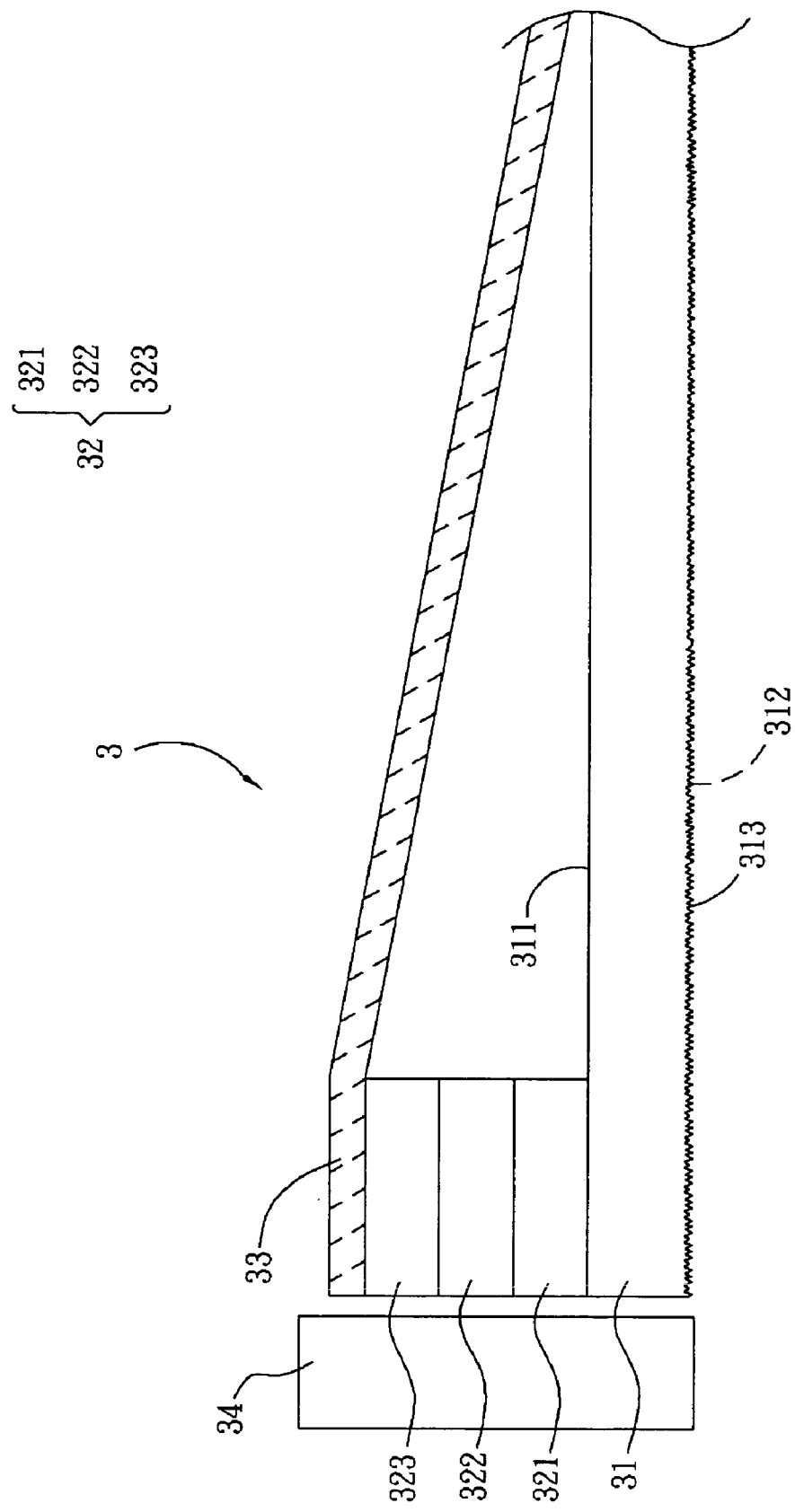

In this embodiment, the light-guiding substrate 31 has a first surface 311 and a second surface 312. The second surface 312 comprises at least one light-guiding part 313, which is a light guiding structure disposed on the light-guiding substrate 31. The light-source area 32 comprises at least one organic electroluminescent device, which sequentially comprises a first electrode 321, at least one organic functional layer 322 and a second electrode 323 disposed over the first surface 311 of the light-guiding substrate 31. The reflecting layer 33 is at least a portion disposed over the second electrode 323. The reflecting layer 33 may be disposed over the second electrode 323 as shown in FIG. 4A, also may be disposed, over the second electrode 323 with an extension toward to the light-guiding substrate 31 as shown in FIG. 4B. At least one light-blocking layer 34 may be further disposed at least one side of the light-guiding substrate 31 to restrict the direction of the light emitted from the organic functional layer 322, and the light is efficiently propagated out from the light-guiding part 313. At least one light-blocking layer (not shown) may be further disposed at one side of the first electrode 321, the organic functional layer 322 and/or the second electrode 323 to restrict the direction of the light emitted from the organic functional layer 322, and the light is efficiently propagated out from the light-guiding part 313.

In this embodiment, the light-guiding substrate 31, the light guiding structure, the organic functional layer 322, the reflecting layer 33 and the light-blocking layer 34 have the same construction and function as those described in the first embodiment. The first electrode 321 is made of the same material as the second electrode 223 of the first embodiment. The second electrode 323 is made of the same material as the first electrode 221 of the first embodiment. The corresponding descriptions are omitted for concise purpose.

In this embodiment, due to the first electrode 321 is an opaque reflective layer, a first light 351 emitted from the organic functional layer 322 is restricted to be propagated out to the direction of the second electrode 323. The first light 351 is reflected by the reflecting layer 33 and the light-blocking layer 34. Finally, a second light 352 is propagated out from the light-guiding part 313. By the light guiding structure of the light-guiding part 313, the second light 352 is uniformly and efficiently propagated out.

Figure 5:
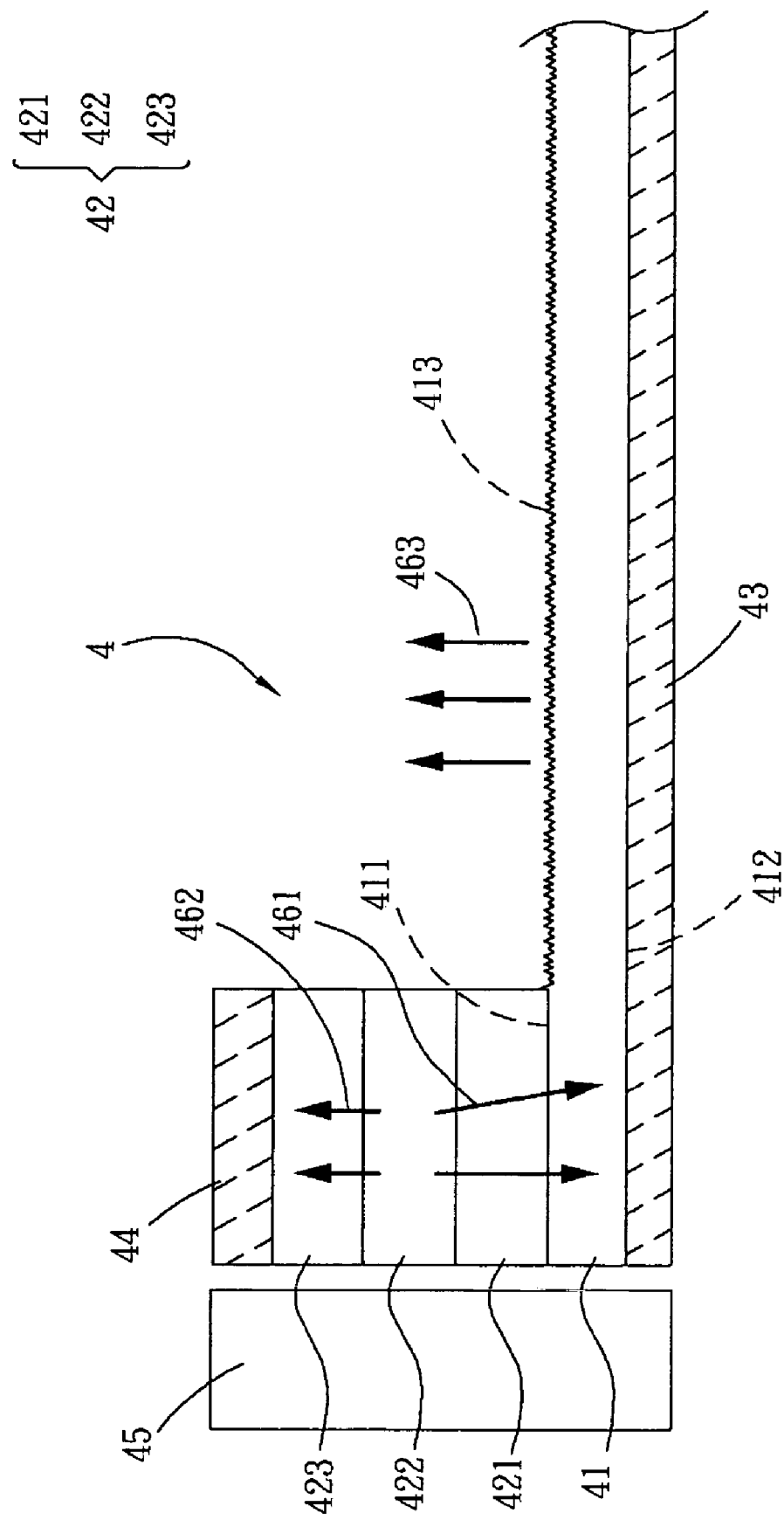
FIG. 5 is a schematic view showing a third embodiment of an organic light-emitting source according to the present invention.

As shown in FIG. 5, a third embodiment of an organic light-emitting source 4 according to the present invention comprises a light-guiding substrate 41, at least one light-source area 42, a first reflecting layer 43 and a second reflecting layer 44.

The light-guiding substrate 41 has a first surface 411 and a second surface 412. The first surface 411 comprises at least one light-guiding part 413, which is a light guiding structure disposed over the light-guiding substrate 41. The light-source area 42 comprises at least one organic electroluminescent device, which sequentially comprises a first electrode 421, at least one organic functional layer 422, and a second electrode 423 disposed over the first surface 411 of the light-guiding substrate 41. The first reflecting layer 43 is disposed over the second surface 412 of the light-guiding substrate 41 to reflect a light to the light-guiding part 413. The second reflecting layer 44 is disposed over the second electrode 423 to reflect the light to the first reflecting layer 43. At least one light-blocking layer 45 may be further disposed at one side of the light-guiding substrate 41 to restrict the direction of the light emitted from the organic functional layer 422, and the light is efficiently propagated out from the light-guiding part 413. At least one light-blocking layer (not shown) may be further disposed at one side of the first electrode 421, the organic functional layer 422 and/or the second electrode 423 to restrict the direction of the light emitted from the organic functional layer 422, and the light is efficiently propagated out from the light-guiding part 413.

In this embodiment, the light-guiding substrate 41, the light guiding structure, the organic functional layer 422 and the light-blocking layer 45 have the same construction and function as those described in the first embodiment. The first reflecting layer 43 and the second reflecting layer 44 have the same construction and function as the reflecting layer 23 of the first embodiment. The first electrode 421 and the second electrode 423 are made of the same material as the first electrode 221 of the first embodiment. The corresponding descriptions are omitted for concise purpose.

In this embodiment, the light emitted from the organic functional layer 422 comprises a first light 461 to the first reflecting layer 43 and a second light 462 to the second reflecting layer 44. The second light 462 is then further reflected to the first reflecting layer 43. Due to the restriction of the light-blocking layer 45, the first light 461 finally combines with the second light 462 to be a third light 463 propagated out from the light-guiding part 413. By the light guiding structure of the light-guiding part 413, the third light 463 is uniformly and efficiently propagated out.

In summary, a reflecting layer light guiding an organic light-emitting source according to the present invention into a light guiding structure may improve waveguide phenomenon within substrate and first electrode, then a light is uniformly and efficiently propagated out to achieve a high external quantum efficiency. The present invention enhances external quantum efficiency of light-emitting source and can be applied to display, lighting or back lighting.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An organic light-emitting source, comprising:
   a light-guiding substrate, having a first surface and a second surface, the first surface comprises at least one light-guiding part, which is a light guiding structure disposed on the light-guiding substrate;
   at least one light-source area, comprising at least one organic electroluminescent device, which sequentially comprises a first electrode, at least one organic functional layer and a second electrode disposed over the first surface of the light-guiding substrate; and
   a reflecting layer, disposed over the second surface of the light-guiding substrate.

2. The organic light-emitting source according to claim 1, wherein the light guiding structure is at least one selected from the group consisting of frosted surface structure, rough surface structure, ITO structure, microlens array structure and multilayer structure.

3. The organic light-emitting source according to claim 1, further comprising
   at least one light-blocking layer, disposed at one side of the light-guiding substrate, the first electrode, the organic functional layer and/or the second electrode.

4. The organic light-emitting source according to claim 1, wherein the light-guiding substrate is at least one selected from the group consisting of rigid light-guiding substrate, flexible light-guiding substrate, transparent light-guiding substrate, glass light-guiding substrate, plastic light-guiding substrate and silicon light-guiding substrate.

5. The organic light-emitting source according to claim 1, wherein the reflecting layer is made of metal or alloy.

6. The organic light-emitting source according to claim 1, wherein the first electrode is made of conductive metal oxide.

7. The organic light-emitting source according to claim 1, wherein the second electrode is at least one selected from the group consisting of aluminum, calcium, magnesium, indium, tin, manganese, silver, gold, magnesium alloy and the combination thereof.

8. An organic light-emitting source, comprising:
   a light-guiding substrate, having a first surface and a second surface, the second surface comprises at least one light-guiding part, which is a light guiding structure disposed on the light-guiding substrate;
   at least one light-source area, comprising at least one organic electroluminescent device, which comprises a first electrode, at least one organic functional layer and a second electrode sequentially disposed over the first surface of the light-guiding substrate; and
   a reflecting layer, at least a portion disposed over the second electrode.

9. The organic light-emitting source according to claim 8, wherein the light guiding structure is at least one selected from the group consisting of frosted surface structure, rough surface structure, ITO structure, microlens array structure and multilayer structure.

10. The organic light-emitting source according to claim 8, further comprising
    at least one light-blocking layer, disposed at one side of the light-guiding substrate, the first electrode, the organic functional layer and/or the second electrode.

11. The organic light-emitting source according to claim 8, wherein the light-guiding substrate is at least one selected from the group consisting of rigid light-guiding substrate, flexible light-guiding substrate, transparent light-guiding substrate, glass light-guiding substrate, plastic light-guiding substrate and silicon light-guiding substrate.

12. The organic light-emitting source according to claim 8, wherein the first electrode is at least one selected from the group consisting of aluminum, calcium, magnesium, indium, tin, manganese, silver, gold, magnesium alloy and the combination thereof.

13. The organic light-emitting source according to claim 8, wherein the second electrode is made of conductive metal oxide.

14. The organic light-emitting source according to claim 8, wherein the reflecting layer is made of metal or alloy.

15. An organic light-emitting source, comprising:
   a light-guiding substrate, having a first surface and a second surface, the first surface comprises at least one light-guiding part, which is a light guiding structure disposed on the light-guiding substrate;
   at least one light-source area, comprising at least one organic electroluminescent device, which sequentially comprises a first electrode, at least one organic functional layer and a second electrode disposed over the first surface of the light-guiding substrate;
   a first reflecting layer, disposed over the second surface of the light-guiding substrate; and
   a second reflecting layer, disposed over the second electrode.

16. The organic light-emitting source according to claim 15, wherein the light guiding structure is at least one selected from the group consisting of frosted surface structure, rough surface structure, ITO structure, microlens array structure and multilayer structure.

17. The organic light-emitting source according to claim 15, further comprising
   at least one light-blocking layer, disposed at one side of the light-guiding substrate, the first electrode, the organic functional layer and/or the second electrode.

18. The organic light-emitting source according to claim 15, wherein the light-guiding substrate is at least one selected from the group consisting of rigid light-guiding substrate, flexible light-guiding substrate, transparent light-guiding substrate, glass light-guiding substrate, plastic light-guiding substrate and silicon light-guiding substrate.

19. The organic light-emitting source according to claim 15, wherein the first reflecting layer and the second reflecting layer are made of metal or alloy.

20. The organic light-emitting source according to claim 15, wherein the first electrode and the second electrode are made of conductive metal oxide.

* * * * *